(12) United States Patent
Raghu et al.

(10) Patent No.: US 9,142,324 B2
(45) Date of Patent: *Sep. 22, 2015

(54) BAD BLOCK RECONFIGURATION IN NONVOLATILE MEMORY

(71) Applicant: SanDisk Technologies Inc., Plano, TX (US)

(72) Inventors: Deepak Raghu, Milpitas, CA (US); Gautam Dusija, Milpitas, CA (US); Chris Avila, Saratoga, CA (US); Yingda Dong, San Jose, CA (US); Man Mui, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 171 days.

This patent is subject to a terminal disclaimer.

(21) Appl. No.: 14/016,785

(22) Filed: Sep. 3, 2013

(65) Prior Publication Data

US 2015/0067419 A1  Mar. 5, 2015

(51) Int. Cl.
| | |
|---|---|
| G11C 29/00 | (2006.01) |
| G11C 29/50 | (2006.01) |
| G11C 16/10 | (2006.01) |
| G11C 16/04 | (2006.01) |
| G11C 29/44 | (2006.01) |

(52) U.S. Cl.
CPC ...... *G11C 29/50004* (2013.01); *G11C 16/0483* (2013.01); *G11C 16/10* (2013.01); *G11C 29/44* (2013.01)

(58) Field of Classification Search
CPC ........... G11C 11/5621; G11C 11/5628; G11C 16/0483; G11C 16/10; G11C 29/44

USPC .................................. 714/723, 721, 718, 733
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,661,053 A | 8/1997 | Yuan |
| 5,768,192 A | 6/1998 | Eitan |
| 5,822,256 A | 10/1998 | Bauer et al. |
| 5,903,495 A | 5/1999 | Takeuchi et al. |
| 6,011,725 A | 1/2000 | Eitan |
| 6,046,935 A | 4/2000 | Takeuchi et al. |
| 6,057,704 A | 5/2000 | New et al. |
| 6,222,762 B1 | 4/2001 | Guterman et al. |

(Continued)

OTHER PUBLICATIONS

Notification of Transmittal of the International Search Report and the Written Opinion of the International Searching Authority, or the Declaration for Int'l Application No. PCT/US2014/050942 mailed Nov. 12, 2014, 20 pages.

(Continued)

*Primary Examiner* — David Ton
(74) *Attorney, Agent, or Firm* — Davis Wright Tremaine LLP

(57) ABSTRACT

When a bad block is found in a nonvolatile memory array, the block is marked as a bad block so that it is not subsequently used. The block is also reconfigured as a bad block by increasing resistance of vertical NAND strings in the block by increasing threshold voltage of at least some transistors along vertical NAND strings, for example, select transistors or memory cell transistors.

23 Claims, 14 Drawing Sheets

(56) References Cited

U.S. PATENT DOCUMENTS

| | | | | |
|---|---|---|---|---|
| 6,769,081 | B1* | 7/2004 | Parulkar | 714/733 |
| 7,111,190 | B2* | 9/2006 | Venkatraman et al. | 714/6.1 |
| 7,490,260 | B2* | 2/2009 | Venkatraman et al. | 714/6.32 |
| 7,502,977 | B2* | 3/2009 | Venkatraman et al. | 714/718 |
| 8,995,184 | B2* | 3/2015 | Takafuji et al. | 365/185.03 |
| 2005/0265081 | A1 | 12/2005 | Tran et al. | |
| 2006/0010335 | A1 | 1/2006 | Venkatraman et al. | |
| 2007/0109856 | A1 | 5/2007 | Pellicone et al. | |
| 2008/0059835 | A1 | 3/2008 | Yoon | |
| 2009/0249140 | A1 | 10/2009 | Yeh et al. | |
| 2009/0268521 | A1 | 10/2009 | Ueno et al. | |
| 2011/0128766 | A1* | 6/2011 | Parkinson | 365/63 |
| 2012/0176836 | A1 | 7/2012 | Iguchi et al. | |
| 2013/0114341 | A1 | 5/2013 | Hung et al. | |
| 2013/0294168 | A1 | 11/2013 | Shirakawa | |
| 2014/0085982 | A1 | 3/2014 | Asaoka et al. | |
| 2014/0160842 | A1 | 6/2014 | Takafuji et al. | |
| 2014/0289559 | A1 | 9/2014 | Hashimoto | |

OTHER PUBLICATIONS

Notice of Allowance and Fees Due for U.S. Appl. No. 14/290,070 mailed Jan. 14, 2015, 20 pages.

Eitan et al., "NROM: A Novel Localized Trapping, 2-Bit Nonvolatile Memory Cell," IEEE Electron Device Letters, vol. 21, No. 11, Nov. 2000, pp. 543-545.

U.S. Appl. No. 13/927,659 entitled "System for Maintaining Back Gate Threshold Voltage in Three Dimensional Nand Memory," filed Jun. 26, 2013, 41 pages.

\* cited by examiner

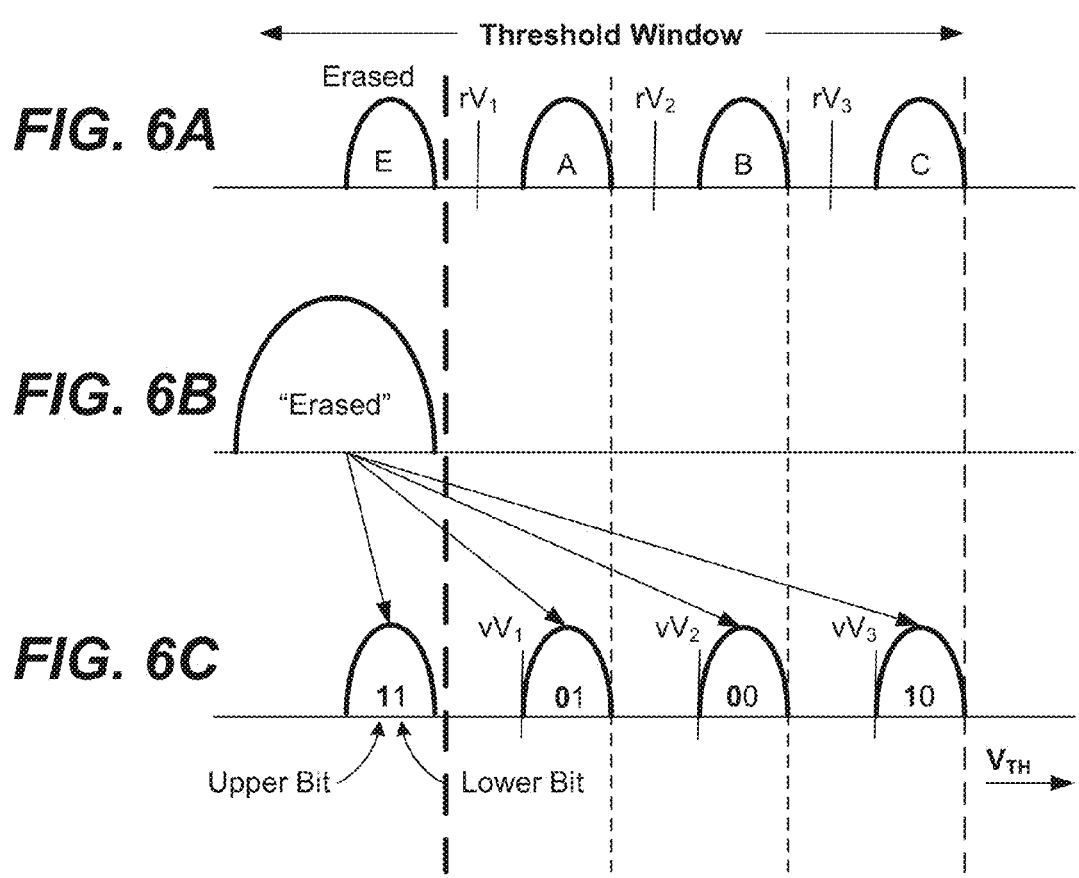
Programming into four states represented by a 2-bit code

— Core 189
— Channel 187
— Tunnel 185
— CTL 183
— Block 181

BAD BLOCK RECONFIGURATION IN NONVOLATILE MEMORY

BACKGROUND

This application relates to the operation of re-programmable nonvolatile three dimensional memory systems such as semiconductor flash memory which record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

A block-erasable nonvolatile memory system identifies bad blocks and records their locations so that they are not subsequently used for storage of host data. Rather than leave bad blocks in their previous state, bad blocks are subject to a reconfiguration operation that increases resistance of NAND strings of the block so that the reconfigured NAND strings have low leakage current and have little effect on bit lines or other blocks. A reconfiguration operation may increase threshold voltage of one or more transistor of a NAND string including: host data memory cells, dummy memory cells, select transistors, and back gate transistors. A portion of a block may also be identified as a bad portion and may be similarly reconfigured while the rest of the block remains in use.

An example of a method of operating a plurality of blocks of a block-erasable nonvolatile memory array includes: identifying a block of the plurality of blocks as a bad block; in response to identifying the block as a bad block, recording location information for the bad block to prevent subsequent storage of host data in the bad block; and in response to identifying the block as a bad block, performing a reconfiguration of the block as a bad block by increasing threshold voltage of at least one transistor of the block.

The at least one transistor may be a select transistor. The at least one transistor may be a memory cell transistor. The at least one transistor may be a dummy memory cell transistor. The at least one transistor may be a back gate transistor. The reconfiguration of the block as a bad block may include increasing threshold voltages of multiple select transistors and multiple memory cell transistors of the block. The reconfiguration of the block as a bad block may include increasing threshold voltages of all select transistors and all memory cell transistors of the block. The reconfiguration of the block as a bad block may include applying voltage pulses to memory cells of the block and verifying increased threshold voltages resulting from the voltage pulses. Subsequent to identifying the block as a bad block, and prior to performing the reconfiguration of the block as a bad block, host data may be copied from the bad block to a location in the memory array that is outside the bad block. The nonvolatile memory array may be a three-dimensional nonvolatile memory array that includes a plurality of horizontal bit lines that connect blocks of a plane including the block identified as a bad block. The plurality of horizontal bit lines may connect vertical NAND strings of the plane, each vertical NAND string comprising a plurality of memory cells and a select transistor connected in series, and the reconfiguration may increase threshold voltages of the memory cells and the select transistors of the block thereby increasing resistance of the vertical NAND strings of the block, while leaving vertical NAND strings of other blocks in the plane unchanged. The identifying a block as a bad block may occur after a period of use of the nonvolatile memory array, including use of the block to successfully store host data. Identifying a block as a bad block may occur during initial test of the nonvolatile memory array, prior to any use of the block to store host data.

An example of block-erasable nonvolatile memory array may include: a plurality of blocks of memory cells, each block having a plurality of NAND strings of memory cells with select transistors at each end of an individual NAND string; a bad block identification circuit that identifies a block as a bad block; and a bad block reconfiguration circuit that reconfigures a block as a bad block by increasing threshold voltages of transistors of the block.

The plurality of NAND strings may be vertical NAND strings and each memory cell may contain a charge trapping layer and each select transistor may contain a charge trapping layer. A bad block mapping circuit may record a location of a bad block so that the bad block is not used for storage of data subsequent to being identified as a bad block.

An example of a method of operating a plurality of blocks of a three dimensional nonvolatile NAND memory array may include: identifying a block of the plurality of blocks as a bad block; in response to identifying the block as a bad block, recording location information for the bad block to prevent subsequent storage of host data in the bad block; and in response to identifying the block as a bad block, performing a reconfiguration of the block as a bad block by increasing threshold voltages of memory cells and increasing threshold voltages of select transistors of the block.

Increasing threshold voltages of memory cells may include programming all memory cells to a predetermined threshold voltage and verifying that substantially all memory cells reach the predetermined threshold voltage. Increasing threshold voltages of memory cells may include programming all memory cells with a predetermined series of voltage pulses without verification. The block may be identified as a bad block because of a programming failure, and data in the block may be copied to another block prior to performing the reconfiguration. The block may be identified as a bad block because of failure to erase obsolete data from the block, and the reconfiguration of the block may be performed without copying the obsolete data from the block Threshold voltages of select transistors may be maintained in a first range in blocks that are not bad blocks, and reconfiguration may increase threshold voltages of select transistors to a second range that is higher than the first range.

An example of a method of operating a block of a block-erasable nonvolatile memory array may include: identifying a portion of the block as a bad portion; in response to identifying the portion as a bad portion, recording location information for the bad portion to prevent subsequent storage of host data in the bad portion; and in response to identifying the portion as a bad portion, performing a reconfiguration of the portion as a bad portion by increasing threshold voltage of at least one transistor of the bad portion, while leaving other portions of the block unreconfigured.

The bad portion may consist of at least one set of strings in the block that is identified as a bad set of strings, with other sets of strings in the block left unreconfigured and subsequently used for storage of host data. The bad portion may consist of at least one layer of memory cells in the block that is identified as a bad layer, with other layers in the block left unreconfigured and subsequently used for storage of host data. Subsequent to performing the reconfiguration of the portion as a bad portion host data may be stored in the other portions of the block, subsequently the block may be erased, and subsequently reconfiguration of the portion as a bad portion may be repeated by increasing threshold voltage of at least one transistor of the bad portion, while leaving the other portions of the block unreconfigured Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of memory cells.

DETAILED DESCRIPTION

Memory System

Figure 1:
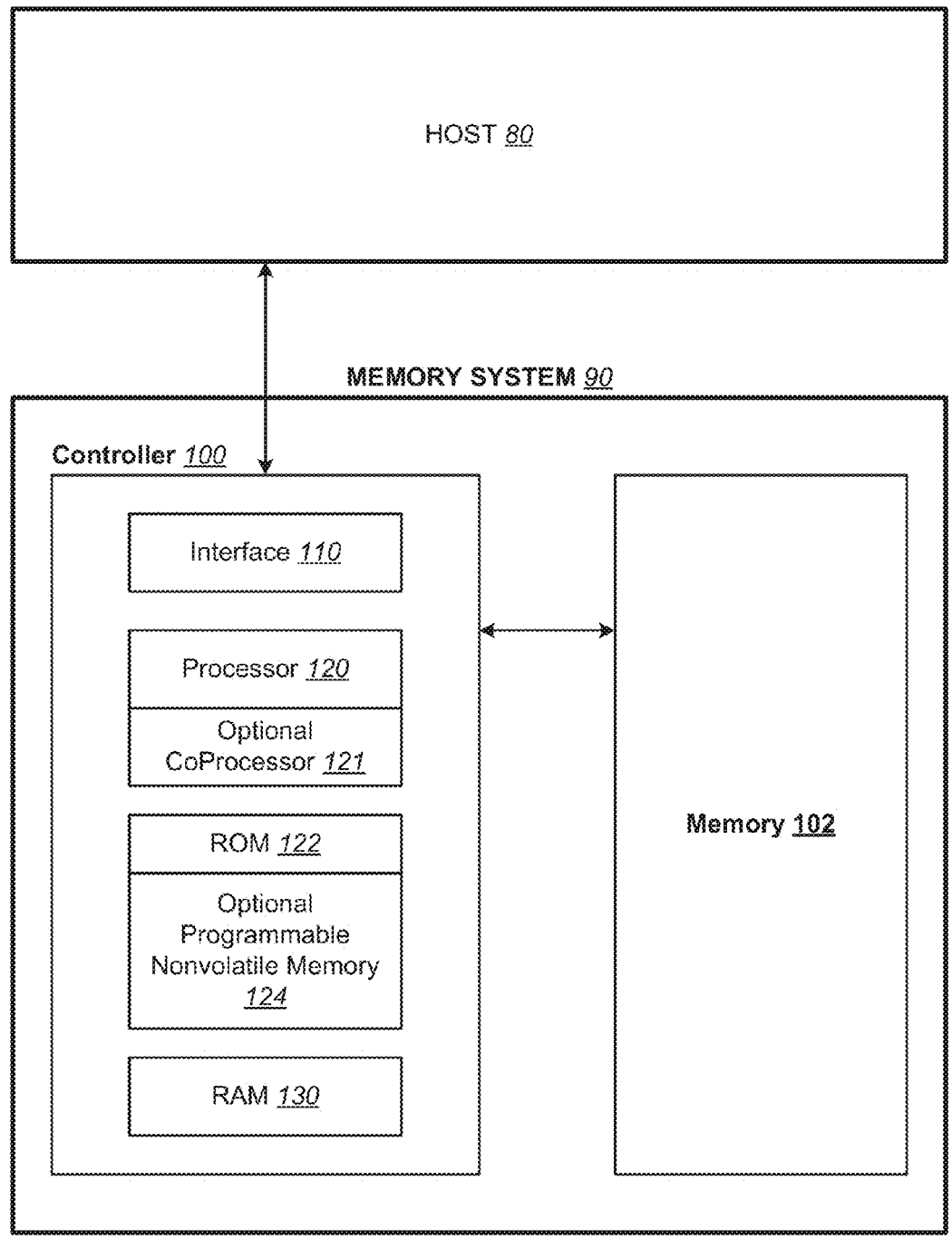
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
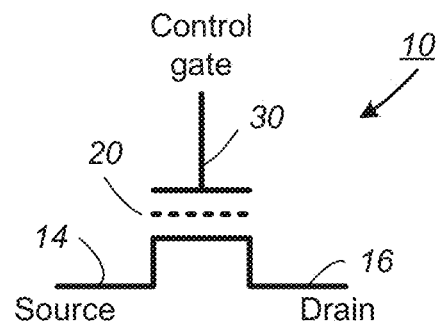
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
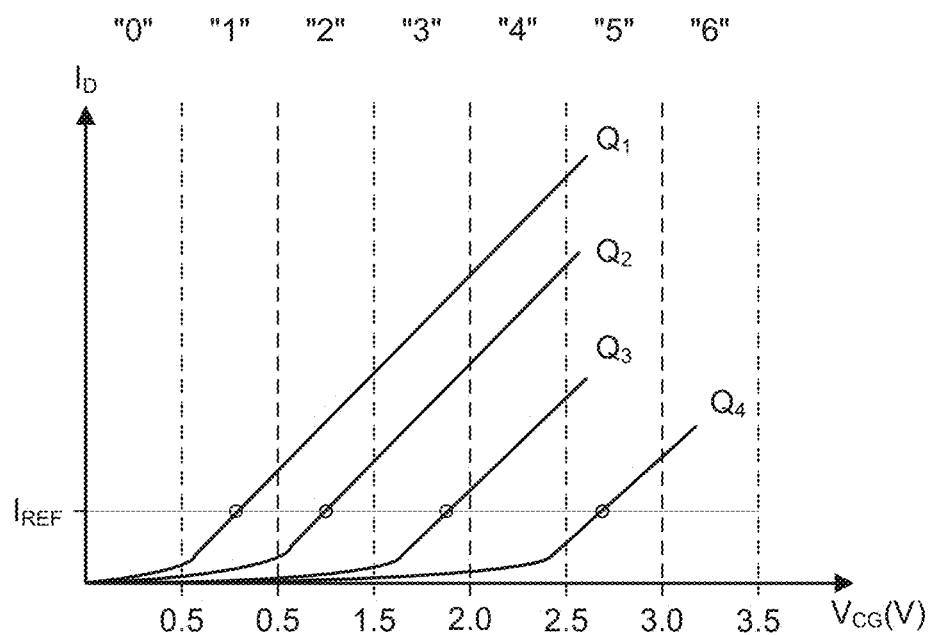
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
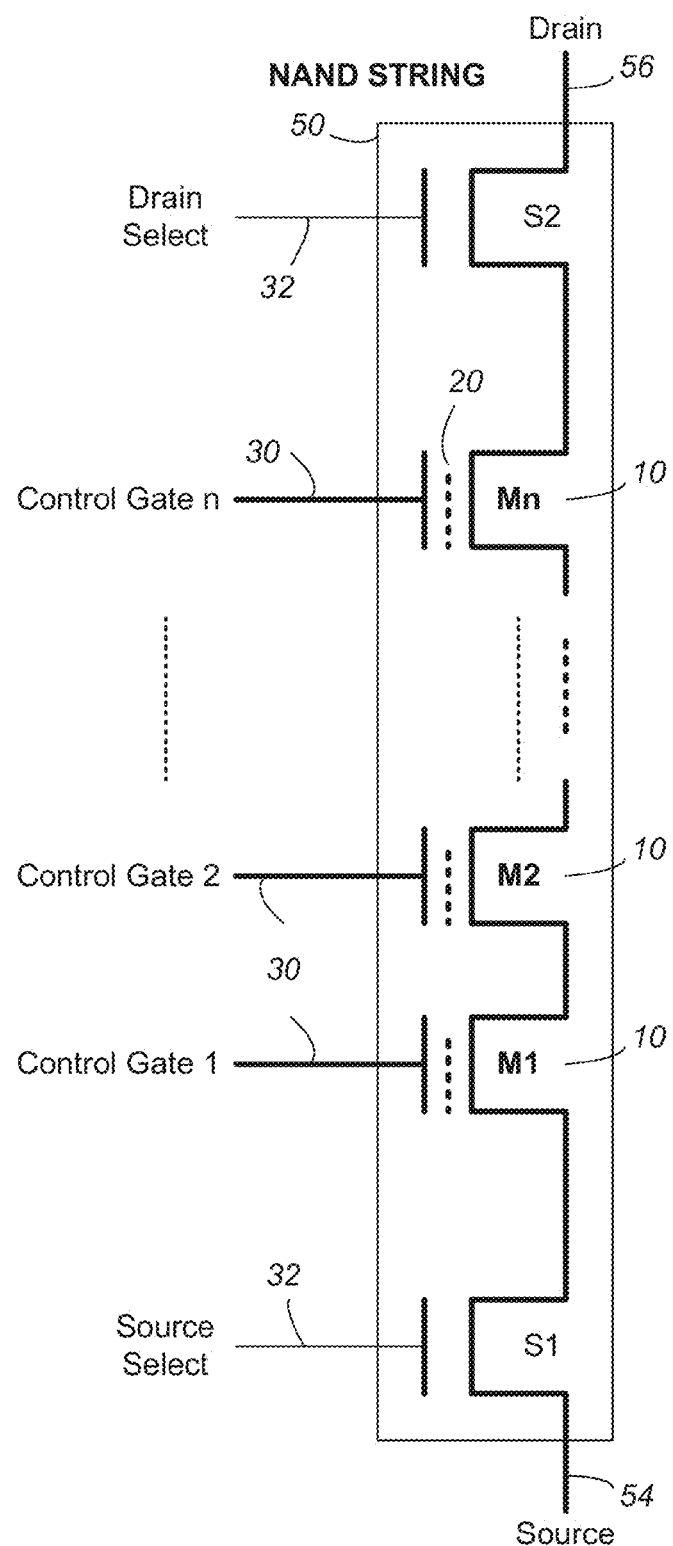
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
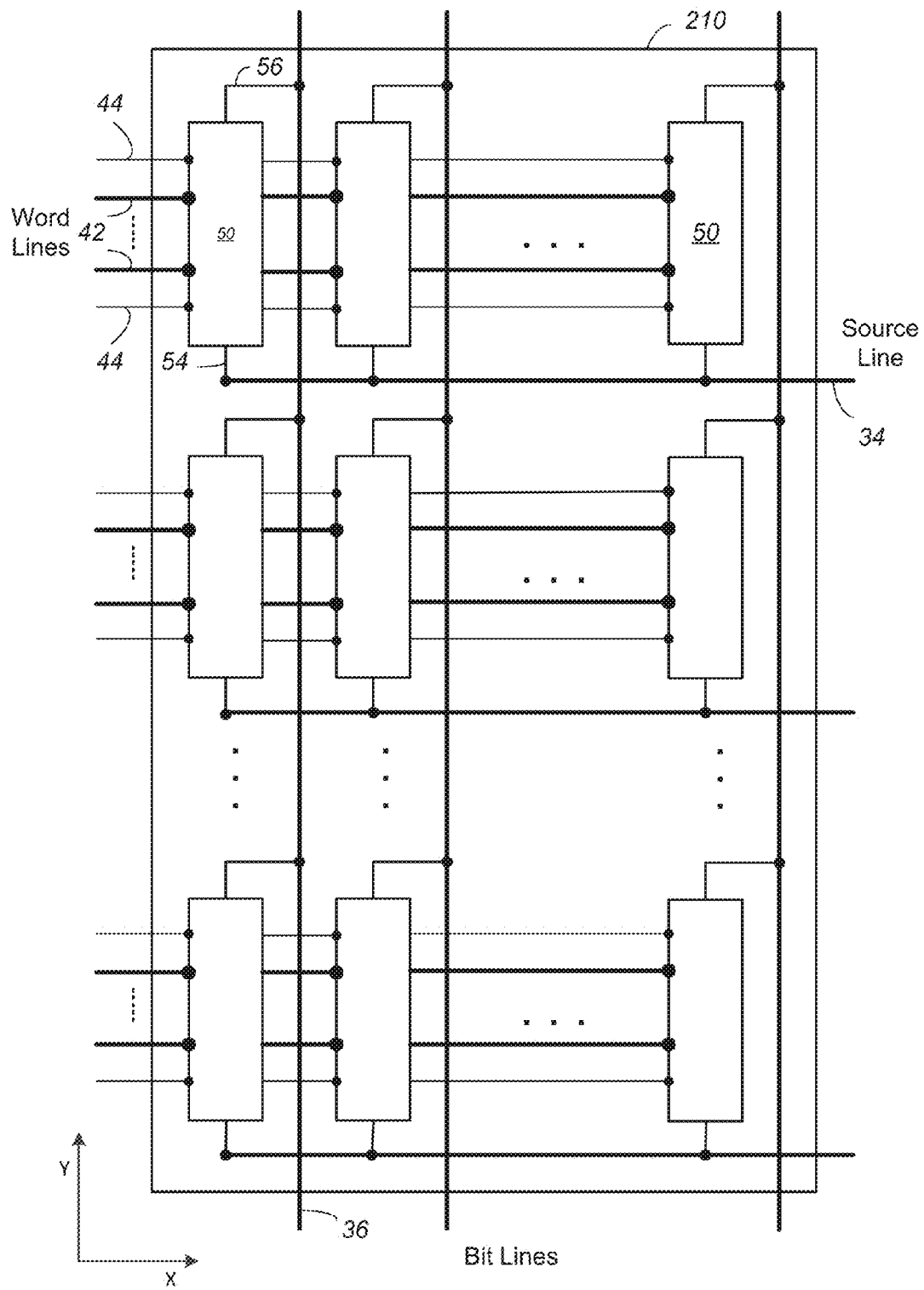
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
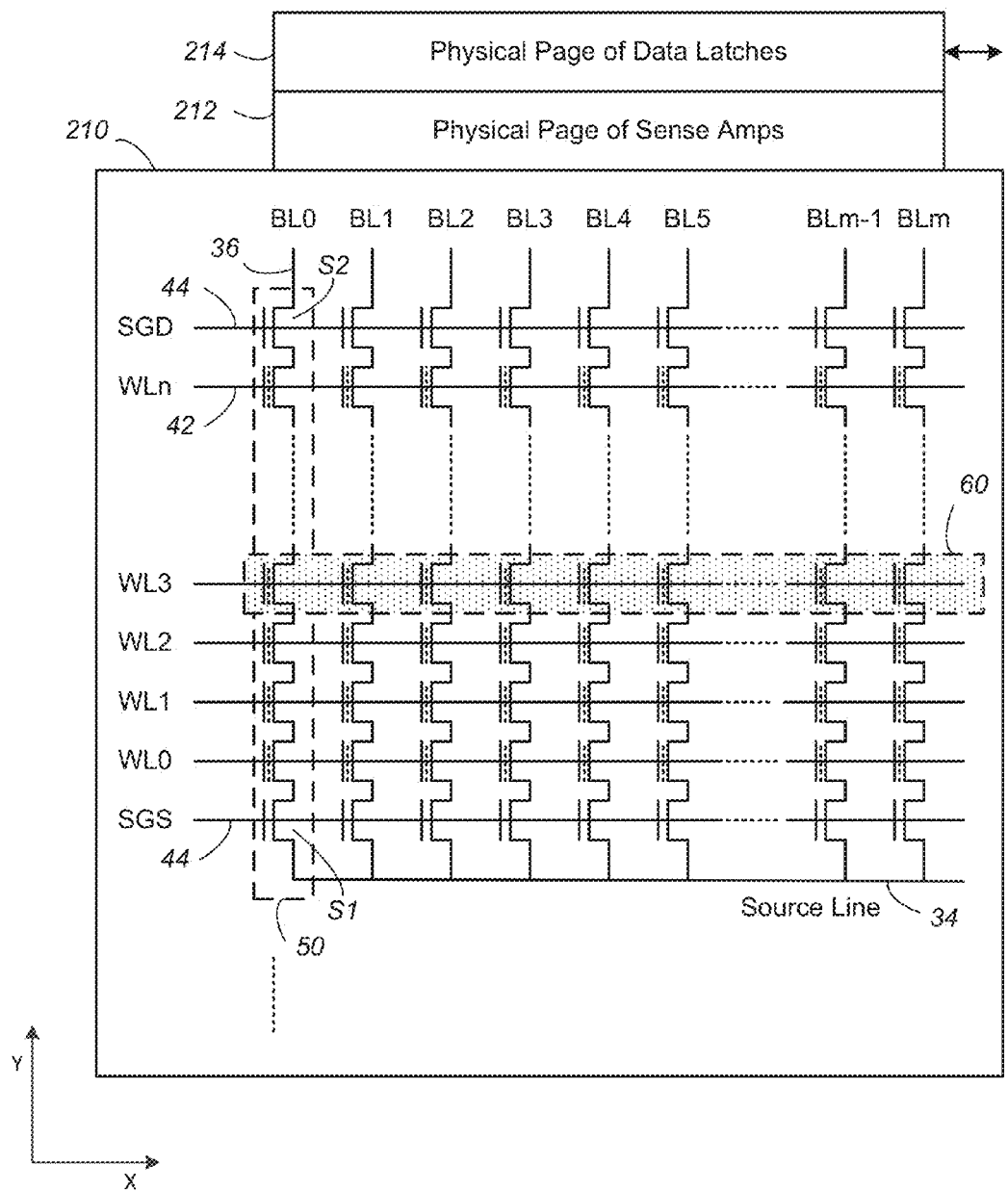
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line.

The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "0", "1", "2" and "3". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 7:
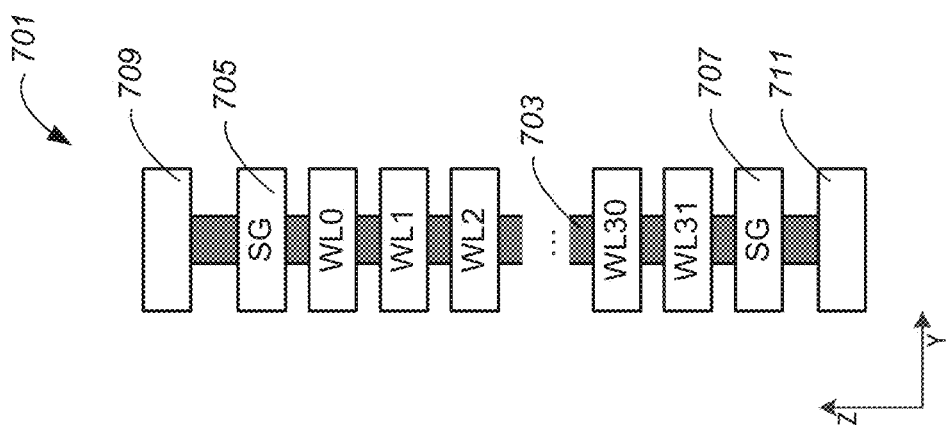
FIG. 7 shows an example of a physical structure of a 3-D NAND string.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
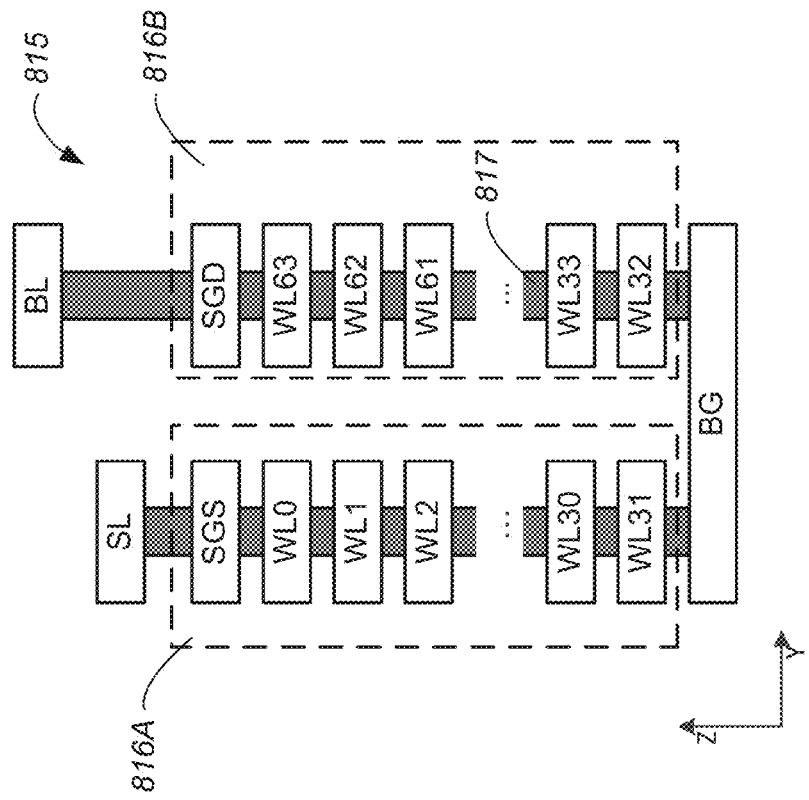
FIG. 8 shows an example of a physical structure of a U-shaped 3-D NAND string.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
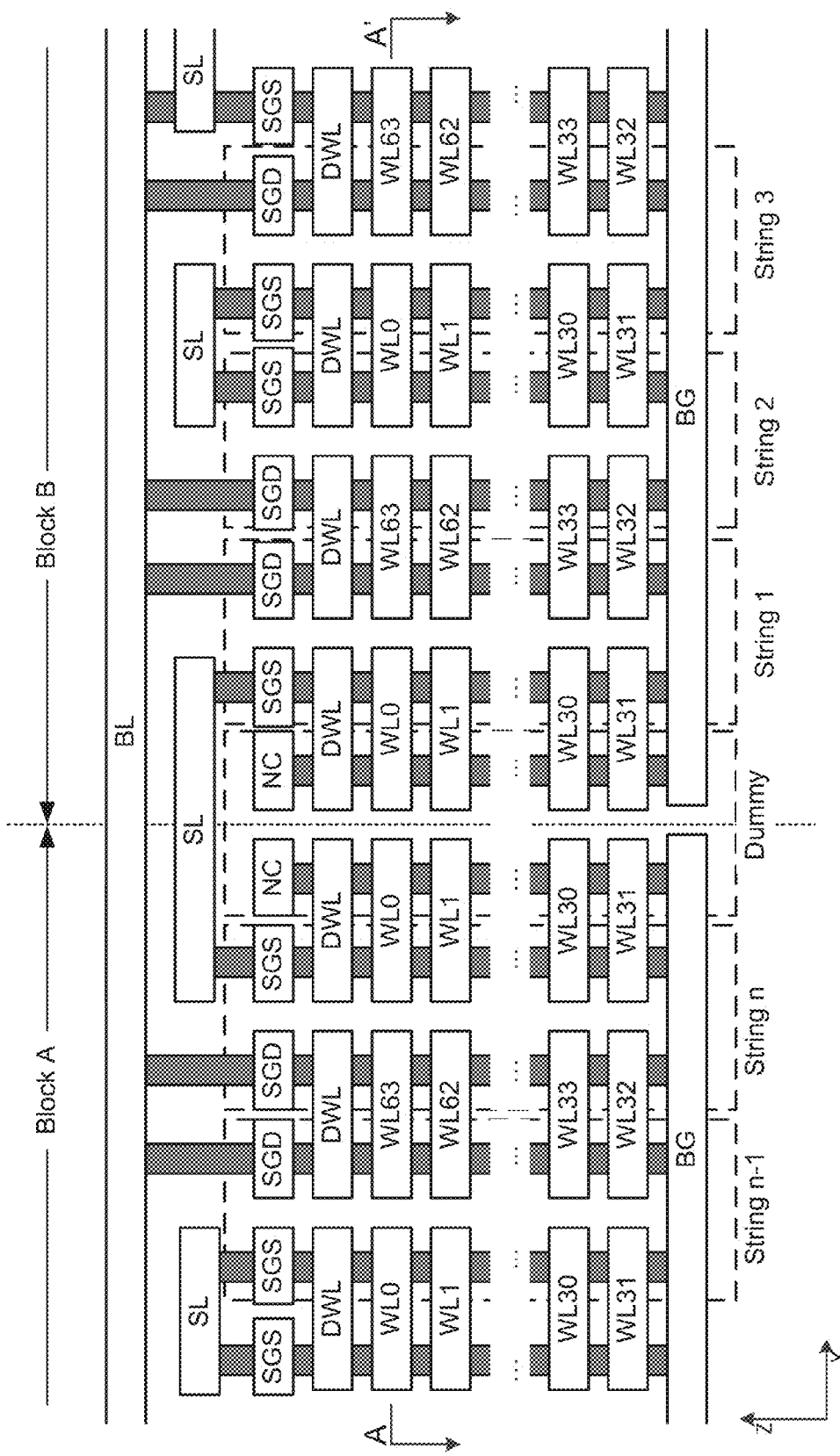
FIG. 9A shows a cross section of a 3-D NAND memory array in the y-z plane.

Vertical NAND strings may be arranged to form a 3-D NAND array in various ways. FIG. 9A shows an example where multiple U-shaped NAND strings in a block are connected to a bit line. In this case, there are n strings (String 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

FIG. 9A shows where two blocks meet. Block A contains n strings connected to the bit line BL. While only strings n, and n−1 of Block A are shown, it will be understood that the repetitive structure continues to the left where strings 1 to n−2 are located. Block B contains n strings connected to bit line BL. While only strings 1-3 of Block B are shown, it will be understood that the repetitive structure continues to the right where strings 4 to n are located. It will also be understood that the cross section shown is along one of many bit lines that serve the block and that there are many similar bit lines extending along the y-direction, separated from each other in the x-direction (e.g. behind the plane of the cross section shown). Word lines extend in the x-direction, perpendicular to the plane of FIG. 9A, to connect sets of strings of different bit lines. Similarly, select lines extend in the x-direction so that a set of strings may be selectively connected, or isolated, as a unit. In the example shown, word lines are formed so that a single conductive strip forms a word line of two adjacent strings. Thus, for example, in Block B, string 1 and string 2 have word lines WL32-WL63 that are formed by common conductive strips. In contrast, select lines are not shared between neighboring strings. This allows separate selection of an individual set of strings within a block, even though the selected set of strings may include word lines that are not separately controllable from word lines of unselected strings.

FIG. 9A shows dummy word lines "DWL" separating select lines SGD, SGS, from host data word lines WL0-WL63. While host data word lines are used to store host data (i.e. data that may be sent to the memory from an external source with the expectation that the data will be returned in response to a read command), dummy word lines do not store host data. They may store nothing, or may store some dummy data that puts the dummy cells in a desirable condition (e.g. puts their threshold voltages at levels that make accessing other cells easier, or reduces risk of disturbance). The dummy word lines shown provide some protection for stored data. In particular, the word line closest to the select gate may be vulnerable to data disturbance because of its proximity to the select gate. By making this word line a dummy word line, the danger of disturbing host data is reduced. In some cases, two or more dummy word lines may be provided between a select line and host data word lines because the risk of disturbance extends more than one word line from the select line. Dummy word lines may be located at other locations besides the single location shown. One or more dummy word lines may be located between host data word lines and the back gate ("BG") for example. Dummy word lines generally have the same physical structure as host data word lines so that the number and location of dummy word lines may be configurable for any given array structure.

Where Block A and Block B meet, there are dummy memory cells in both blocks (i.e. between String n of Block A and String 1 of Block B). A wing of a NAND string of dummy cells is provided in each block in this example so that host data word lines of the two blocks are separated by two dummy word lines. This is to reduce disturbance that might occur if host data word lines of different blocks were immediately adjacent to each other. Dummy select lines, which are not connected to control circuits (marked "NC" for "not connected") are also provided where neighboring blocks meet in this example. Different arrangements of dummy word lines, and other dummy structures between blocks are possible according to memory design and operating requirements. For example, select lines may be connected, back gates of neighboring blocks may be in closer proximity than shown, dummy word lines may be connected in different ways, etc.

Each block has a separate back gate, BG, so that back gate transistors of different blocks may be separately controlled. Back gates extend in the x-direction, perpendicular to the cross section of FIG. 9A, so that all back gate transistors of a block are controlled by a common back gate in this example. Control circuits are connected to the back gates of each block so that appropriate bias may be applied to back gates. The structure of back gates is further explained below.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 9B:
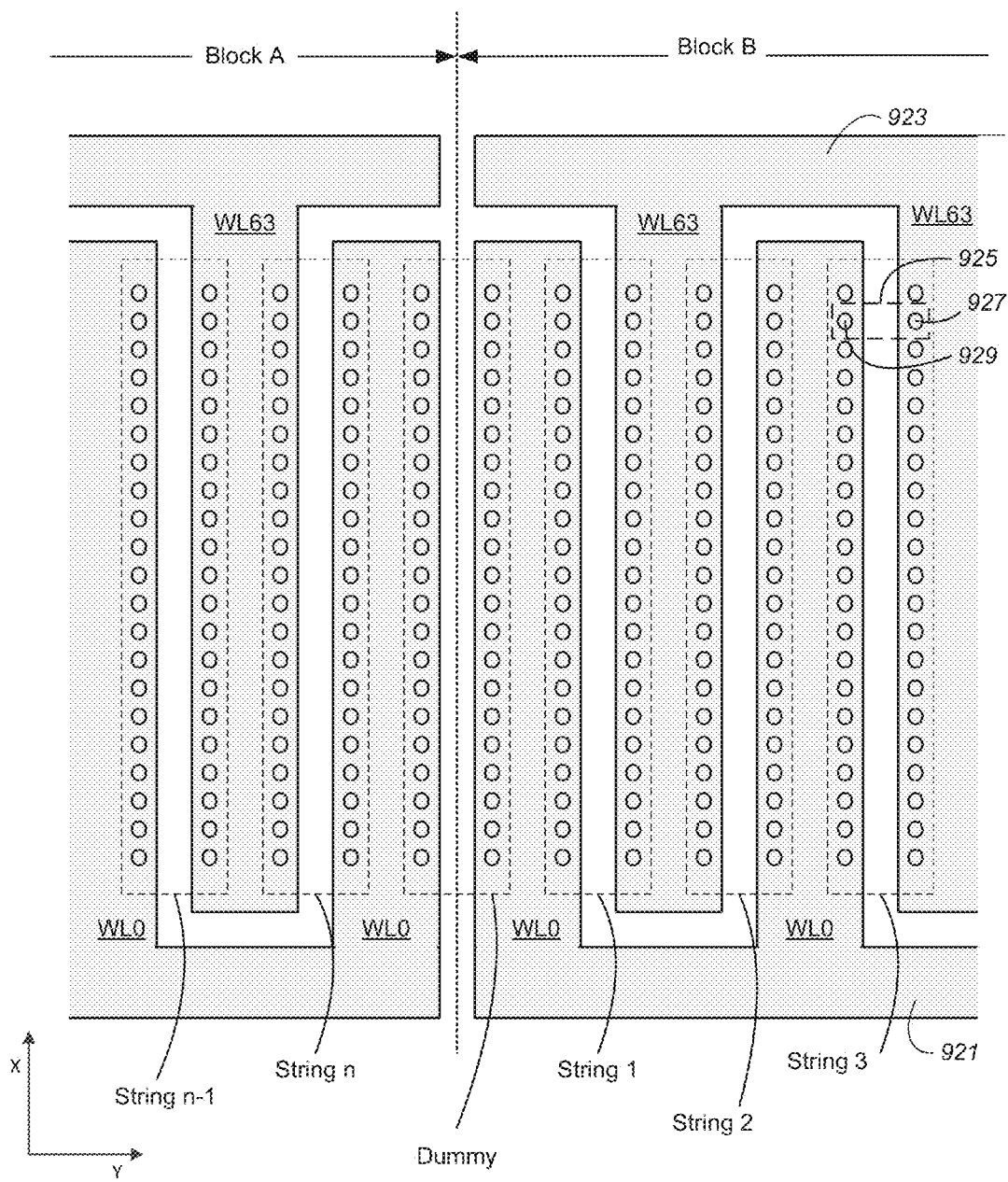
FIG. 9B shows a cross section of the 3-D NAND memory array of FIG. 9A along the x-y plane.

The 3-D NAND memory array of FIG. 9A is further illustrated in FIG. 9B, which shows a cross section along A-A' of FIG. 9A (i.e. along the x-y plane that intersects WL0 and WL63). It can be seen that word lines of a block are formed of strips of conductive material that are connected together. Thus, all word lines marked WL0 in different strings of a block are electrically connected together and are formed from a single electrically conductive body 921. Similarly, all word lines marked WL63 in different strings of a block are electrically connected together and are formed from a single electrically conductive body 923. The two bodies that form word lines of a block on a given level appear as interdigitated fingers extending from opposite sides of the block. These two bodies may be separated by Shallow Trench Isolation (STI) dielectric, or by any suitable insulator. A similar pattern may be found at each level of word lines (e.g. WL1 and WL62 are similarly interdigitated, as are WL2 and WL61, and so on). Word lines of different blocks are isolated from each other. Thus, WL0 of Block A is separate, and electrically isolated from WL0 of Block B. Similarly, WL63 of Block A is separate, and electrically isolated from WL0 of Block B.

Memory holes are shown as circles (memory holes are cylindrical in shape and extend in the z-direction, perpendicular to the cross section shown). A U-shaped NAND string 925 extends along two memory holes 927, 929, with one memory hole 927 passing through body 923 and the other memory hole 929 passing through body 921. A set of strings consists of all such strings that are aligned along the x-direction and that share select lines (which also extend along the y-direction). For example, one such set is made up of all strings indicated by "String 3" in Block B, including string 925. When a given set of strings within a block is selected, a selected word line (or portion of a word line, i.e. a subset of the bit lines that intersect the word line) may be read by applying appropriate word line voltages to the selected word line and to unselected word lines. A Back Gate (not shown in FIG. 9B) extends under the word lines of Block B to control all BG transistors of all strings in the block. When an appropriate bias is applied to the BG of Block B, the back gate transistor of string 925 and back gate transistors of all other similar strings indicated by "String 3" turn on to enable accessing of memory cells of String 3

Figure 10A:
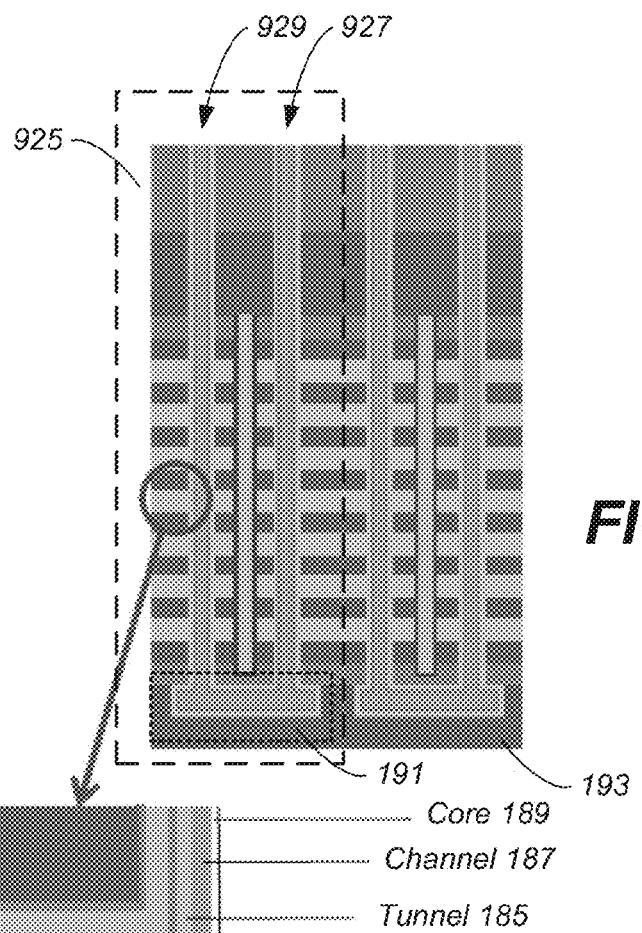
FIGS. 10A-10B shows examples of structures of NAND strings.

FIG. 10A shows a cross section along a y-z plane that intersects memory holes 927, and 929 of NAND string 925 so that the structures formed within memory holes may be clearly seen. FIG. 10A shows that memory holes 927 and 929 are connected together at the bottom so that the two wings may be electrically connected in series.

Figure 10B:
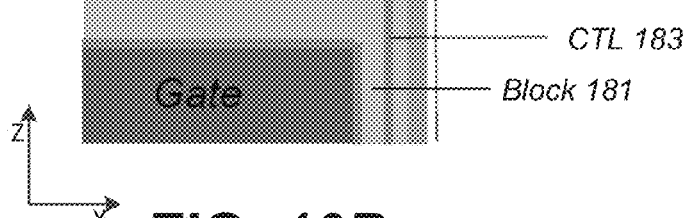

FIG. 10B shows the structure of a stack of layers in the memory hole 929 where memory cells are formed. It can be seen that a blocking dielectric "Block" 181 is deposited on the walls of the memory hole to provide electrical isolation. A Charge Trapping Layer (CTL) 183 is deposited on the blocking dielectric 181. The CTL layer 183 forms charge storage elements where the CTL is in close proximity to polysilicon word lines. A tunnel dielectric 185 is deposited to provide electrical isolation and to allow charge to tunnel into the CTL layer 183 under certain conditions. A channel layer 187 is deposited to form the channel of the memory cells along the string. A core material 189 is deposited that forms the core of the column that is located in the memory hole.

When a NAND string is made using a memory hole, layers are deposited within the cylindrical memory hole so that the memory hole is filled in a substantially uniform manner with all deposited layers being present in at all levels (though some variation in memory hole diameter and other dimensions may occur). In contrast to planar NAND, where films deposited on a substrate surface can be patterned by photolithography, films deposited within a memory hole are generally not exposed in a manner that allows such patterning. As a result, charge storage elements formed by a charge trapping layer may be present in select transistors. To deal with this, select transistors may be managed in a way that maintains their characteristics within desirable ranges. Examples of such management are described in U.S. patent application Ser. No. 13/801,800, filed on Mar. 13, 2013.

Back gate transistors are typically formed by depositing the same layers that fill memory holes in a tube that extends between memory holes of a NAND string. The tube may be formed using a sacrificial material that is etched away by a selective etch. The tube may be formed in a layer of the substrate that is appropriately doped, or within a layer of conductive material that overlies the substrate, so that the material enclosing the tube forms an electrically conductive gate of the back gate transistor. The layer of conductive material may form a common gate of all back gate transistors of a block. The layer may be patterned so that back gates of neighboring blocks are not connected, i.e. each block contains a portion of the conductive layer that is isolated from portions of other blocks. Each such portion may be separately connected to a peripheral circuit to allow control of back gates on a block by block basis.

FIG. 10B shows a cross section of a back gate transistor 191 of NAND string 925 including the stack of materials that fill the tube within the back gate layer 193 (the same stack as in memory hole 929). Examples of back gate structure and operation are described in U.S. patent application Ser. No. 13/927,659.

Figure 11:
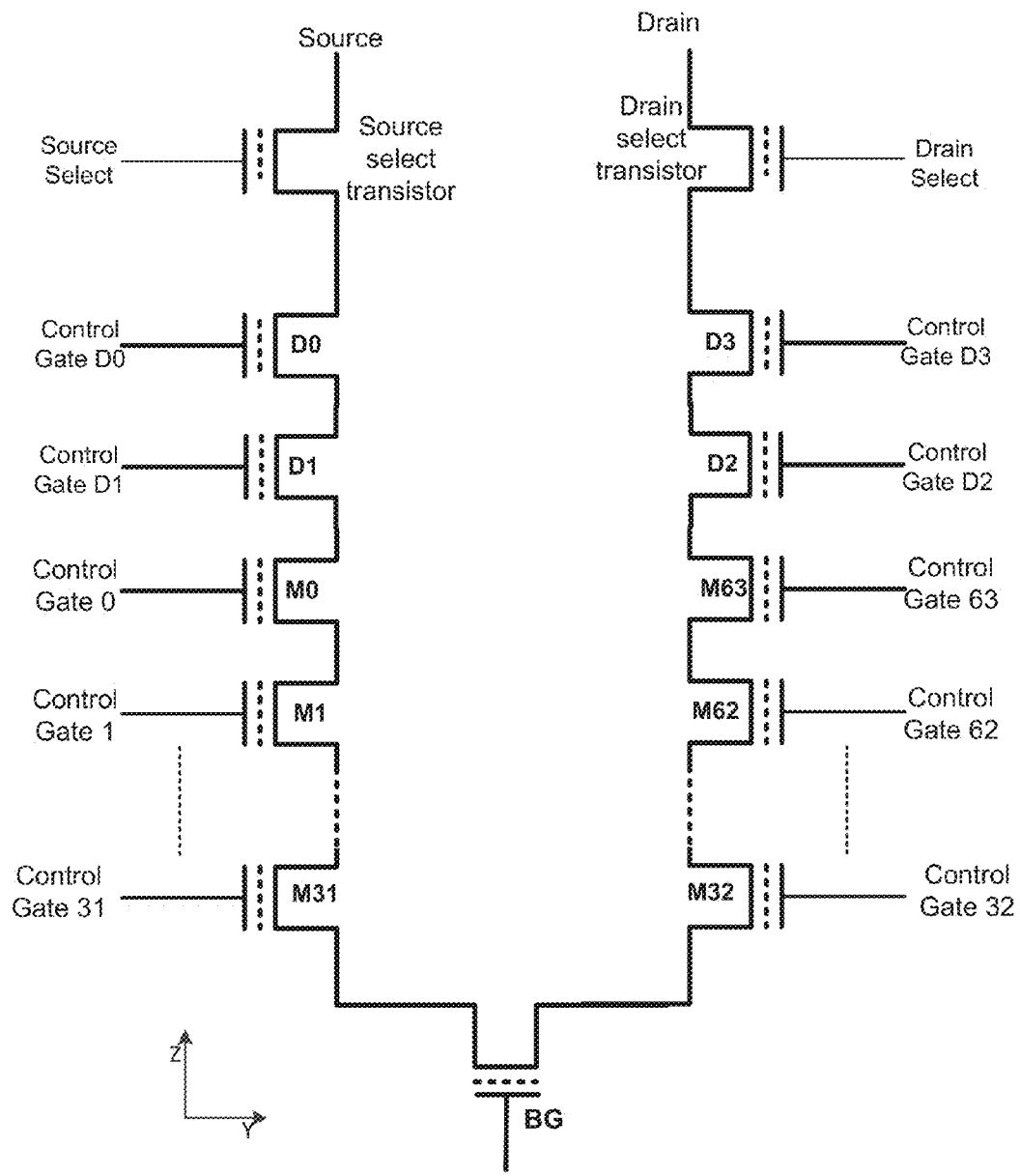
FIG. 11 is a schematic of a NAND string with two wings connected by a back gate.

FIG. 11 shows a schematic of a U-shaped NAND string including host data memory cells M0-M63, dummy memory cells D0-D3, a source select transistor, a drain select transistor, and a back gate transistor BG connected in series. The select transistors, dummy cells, and the back gate transistor contain charge storage elements (similar to host data memory cells). Over time, the threshold voltages of select transistors, dummy memory cells, and back gate transistors may change and this change may affect operations that access memory cells along the NAND string connected to the back gate transistor. Examples of operations to maintain threshold voltages of select transistors and dummy cells within desired ranges are described in U.S. patent application Ser. No. 13/801,800, filed on Mar. 13, 2013. Examples of operations to maintain threshold voltages of back gate transistors within desired ranges are described in U.S. patent application Ser. No. 13/927,659 filed on Jun. 26, 2013.

Bad Blocks

In some memory systems, bad blocks are identified and their locations recorded so that they are not used for storage of host data, Bad blocks may be identified during initial testing of a memory die, or may be identified later. In some cases, a block that is initially good is used to store host data over a period of time, and is then found to be bad (e.g. because of wear from write-erase cycles). For example, read, write, or erase failure may cause the block to be identified as a bad block. When such identification occurs, any valid data in the block that can be copied from the block is copied to another location outside the block. The block is not subsequently used for storage of host data.

Blocks that are identified as bad blocks may have their locations recorded so that they are not subsequently addressed. Thus, no data is written in such blocks and there are no attempts to read or erase such blocks. Memory systems are commonly designed with a physical capacity that is greater than a specified capacity so that a memory can store a specified amount of data even if it has a number of bad blocks. The bad blocks are simply removed from the pool of available blocks.

In many planar NAND memory arrays, the presence of bad blocks has little effect on other blocks in the same plane, or elsewhere in the nonvolatile memory array. Select transistors isolate bad blocks from the rest of the memory array and lateral spacing between blocks limits interactions between cells of neighboring blocks. In contrast, bad blocks in some three dimensional memory arrays may significantly affect other blocks in a three dimensional memory array, particularly other blocks in the same plane, that share the same set of bit lines.

For example, in a three dimensional memory such as shown in FIG. 9A, n vertical NAND strings in each block of the plane are connected to each bit line that serves the plane. Each such vertical NAND string may provide some amount of current leakage between a bit line and a common source line. Vertical NAND strings are connected in parallel so that even if each individual NAND string has a relatively small leakage current, the cumulative effect of such NAND strings may be significant. For example, a bad block may contain unprogrammed memory cells that tend to allow more leakage current through the NAND string than if memory cells were programmed. Select transistors may not be sufficient to reduce such leakage current to an acceptable level. A plane with one or more bad blocks may have sufficient leakage through NAND strings of bad blocks to affect bit line voltage and thus impact access to good blocks in the plane. Furthermore, because bad blocks may contain only unprogrammed cells, the amount of charge in such blocks may be significantly different to the amount of charge in used blocks, which may contain significant charge in charge storage elements of memory cells. The absence of charge may affect cells of neighboring blocks by allowing some charge leakage from such cells.

In addition to bad block identification, some memory systems may identify portions of blocks as bad so that they are not subsequently used (while other portions of the same block continue to be used). For example, a set of strings in a three dimensional NAND array may be designated as a bad set of strings, while other sets of strings in the same block may continue to be used. One or more layers in a block of a three dimensional NAND array may be designated as bad layers, while other layers in the same block may continue to be used.

According to an aspect of the present invention, a block that is identified as a bad block is reconfigured to reduce leakage current through NAND strings of the block. Rather than simply leaving the bad block in an erased state, the block is subject to a reconfiguration process that puts it in condition to allow little or no leakage current between bit lines and a common source line connected to the bad block. Similarly, portions of blocks may be reconfigured as bad portions while other portions in the same blocks continue to be used.

Various methods may be used to increase the resistance of NAND strings, and thus reduce leakage current through NAND strings, as part of a reconfiguration process. For example, where select transistors contain a charge storage element (e.g. charge trapping layer), the select transistors may be subject to a process that increases the threshold voltage of the select transistors and thus reduces leakage. Back gate transistors may be similarly subject to a process that increases their threshold voltages. Memory cells, including dummy memory cells, may be subject to a programming operation to raise their threshold voltages to some level that is higher than the erased level.

Figure 12A:
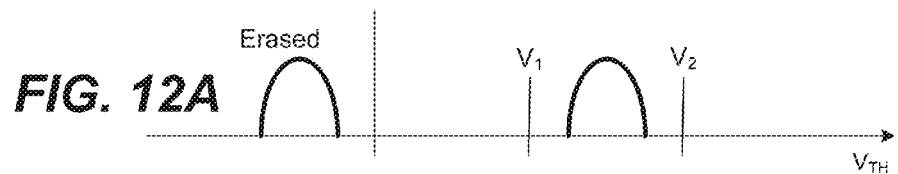
FIG. 12A-E show examples of threshold voltage distributions for select transistors and back gate transistors.

FIG. 12A shows an example of threshold voltages of select transistors or back gate transistors. In particular, FIG. 12A shows how such transistors may have a desirable threshold voltage range between V1 and V2 that is higher than the erased threshold voltage distribution. The distribution shown in FIG. 12A corresponds to select transistors or back gate transistors that have been subject to some tuning to bring their threshold voltages within the desirable range (desirable ranges may be different for select transistors and back gate transistors). This is typically a range that allows such transistors to be efficiently turned on or off.

Figure 12B:
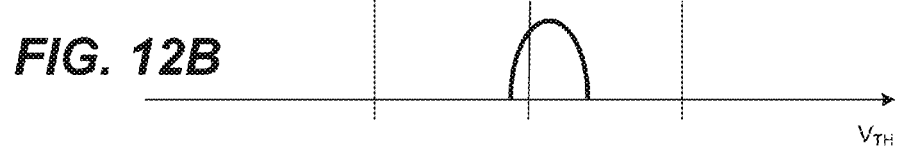
Figure 12C:
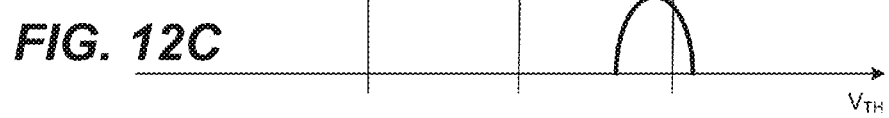
Figure 12D:
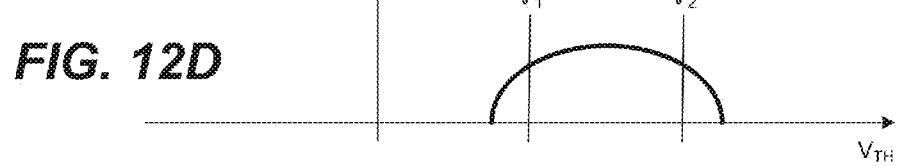

FIG. 12B shows an example of how threshold voltage of select transistors or back gate transistors may drop below a desired range, FIG. 12C shows an example of how such threshold voltages may rise above the desired range, and FIG. 12D shows an example of how such threshold voltages may become distributed so that some are below the desired range and some are above the desired range. Appropriate action may be taken when any of these situations occurs so that the transistors are returned to the desired threshold voltage range.

While a particular threshold voltage range may be desirable for normal operation of a select transistor or back gate transistor the same threshold voltage range may not be desirable when the transistor is in a NAND string that will not be operated. For example, where such a NAND string is in a bad block, or a bad set of strings in a block, there is no further reason to make the NAND string conductive. It is generally desirable that the resistance of such a string be increased so that any leakage current through the string is reduced. Therefore, such transistors may have their threshold voltages raised to a level that is higher than the desired range for operating such transistors.

Figure 12E:
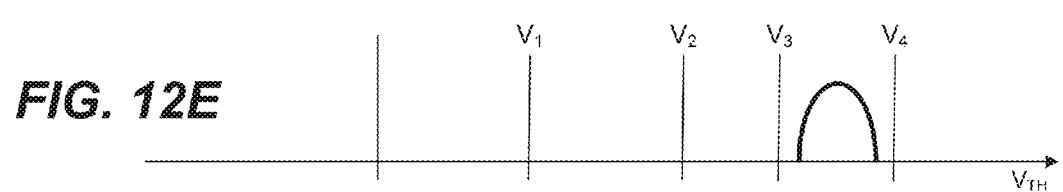

FIG. 12E shows an example of select transistors or back gate transistors that have threshold voltages in a range V3-V4, which is higher than the desirable range for operational NAND strings V1-V2. In this example, V3-V4 is a threshold voltage that ensures that leakage current through the transistors is small. In some cases, there may be no upper limit to the desired threshold voltage range (i.e. no V4) so that such transistors simply have their threshold voltages raised above a certain threshold voltage (e.g. V3). Accuracy in such operations may not be important so that verification may not be necessary (i.e. such transistors may be subject to a predetermined sequence of pulses blindly, without any verification to see if they have reached a particular threshold voltage level).

While FIG. 12E shows how threshold voltages of select transistors and back gate transistors may be increased, memory cells (including dummy memory cells) may also have their threshold voltages increased. For example, memory cells of a NAND string that is in a bad block, or in a bad portion of a block, may have their threshold voltages increased by a programming operation.

Figure 13:
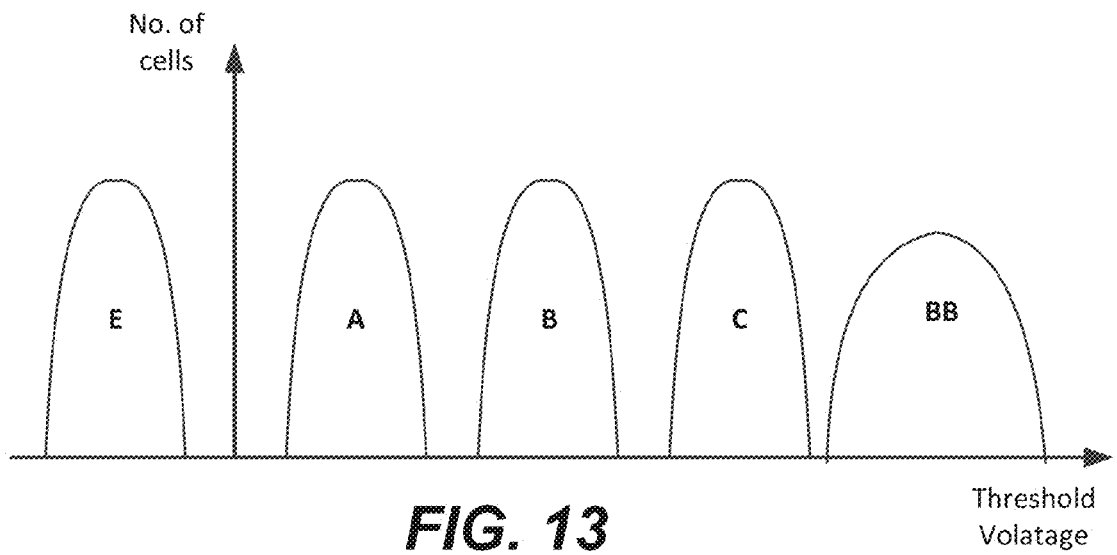
FIG. 13 shows examples of threshold voltage distributions for memory cells.

FIG. 13 shows an example of cells of an MLC memory that has four memory states, the erased state, "E", and programmed states, "A", "B", and "C". Memory cells that are not going to be accessed may be programmed to a threshold voltage range that significantly reduces current leakage through the NAND string in which they are located. Depending on the memory design and the particular threshold voltage assigned to different memory states, such a threshold voltage may correspond to state A, B, or C, or may be different to any of these threshold voltage ranges. For example, because a memory cell in a bad block, or bad portion of a block, is not to be used subsequently it may be programmed to a higher threshold voltage than is used to store data. FIG. 13 shows distribution BB that is higher than any of the assigned memory states.

The distribution BB may be achieved by applying a predetermined series of pulses and verification steps that may be similar to a conventional programming. Alternatively, a predetermined series of pulses may be used without verification because accuracy may not be critical. Programming pulses used may be larger (higher voltage) than conventional programming pulses so that such programming may be completed rapidly.

It should be noted that the programming operation described here is not limited to memory cells that are normally used to store host data (host data memory cells) but includes dummy memory cells. In many cases, dummy memory cells are not used to store data and are never accessed (not programmed, read, or erased) though they may have a structure that is the same as other memory cells and may be connected in a manner that allows access. In other cases, dummy cells have their threshold voltages maintained in a desirable target range, similarly to that shown in FIG. 12A. Dummy cells may have their threshold voltages raised to a higher level when they are in a bad block or bad portion, similarly to host data memory cells of FIG. 13.

In addition to bad blocks and bad sets of NAND strings in a block, a portion of a block may become bad when one or more layers in the block is defective. For example, word lines of a layer (e.g. WL30 and WL33 of Block A of FIG. 9A) may be shorted together so that memory cells in the layer are unusable. Also, memory cells along neighboring word lines may be unusable because it is not possible to bias the shorted word lines appropriately. Thus, a portion of block A that includes lower word lines is considered a bad portion and may be identified as such (its location may be recorded in a bad portion map so that no data is stored there). Subsequently, it may be desirable to raise threshold voltages of memory cells (including dummy memory cells) in such a bad portion so that other layers in the block may be accessed.

When a portion of a block is reconfigured as a bad portion, the remaining portions of the block (the good portions) continue to be used to store host data. Subsequently, when all host data stored in the block becomes obsolete, the block may be erased. This may affect the bad portion of the block as well as the good portions. For example, memory cells in the bad portion that had their threshold voltages raised during reconfiguration may have their threshold voltages returned to erased levels during erase of the block. Therefore, it may be necessary to repeat a reconfiguration operation (at least with respect to memory cells) on the bad portion of the block after an erase operation. Such reconfiguration may be repeated every time the block is erased. Reconfiguration of select transistors may not be necessary.

Figure 14:
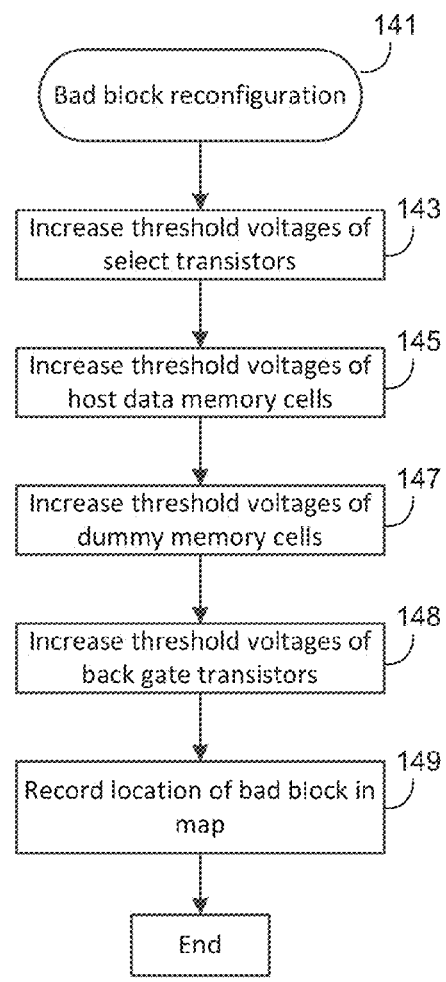
FIG. 14 illustrates a scheme for reconfiguring bad blocks.

FIG. 14 is a flowchart showing how a bad block may be reconfigured 141. Threshold voltages of select transistors are increased 143 to a level that is above the desirable range for operational select transistors. Threshold voltages of host data memory cells are raised 145 to a level that may correspond to a programmed memory state, or may be different (e.g. higher than any memory state). Threshold voltages of dummy memory cells are also raised 147 to a level that may be the same as the host data memory cells. Threshold voltages of back gate transistors are also raised 148 to higher levels. The location of the bad block is recorded 148 in a bad block map or other recording structure so that no subsequent access to the block is permitted. Reconfiguration of a bad portion of a block may be similarly performed.

While the example of FIG. 14 shows threshold voltages of select transistors, host data memory cells, dummy memory cells, and back gate transistors all being increased in a reconfiguration operation, it may not be necessary to perform all of these steps. In some cases, reconfiguring select transistors alone is sufficient. In other examples, only host data memory cells are reconfigured, or only a subset of the host data memory cells are reconfigured. Reconfiguration may be applied on all transistors in a block, or to any suitable subset of the transistors of a block. In cases where a partial block is bad, reconfiguration may be applied to all transistors in the bad portion, or to any suitable subset of the transistors of the bad portion.

Figure 15:
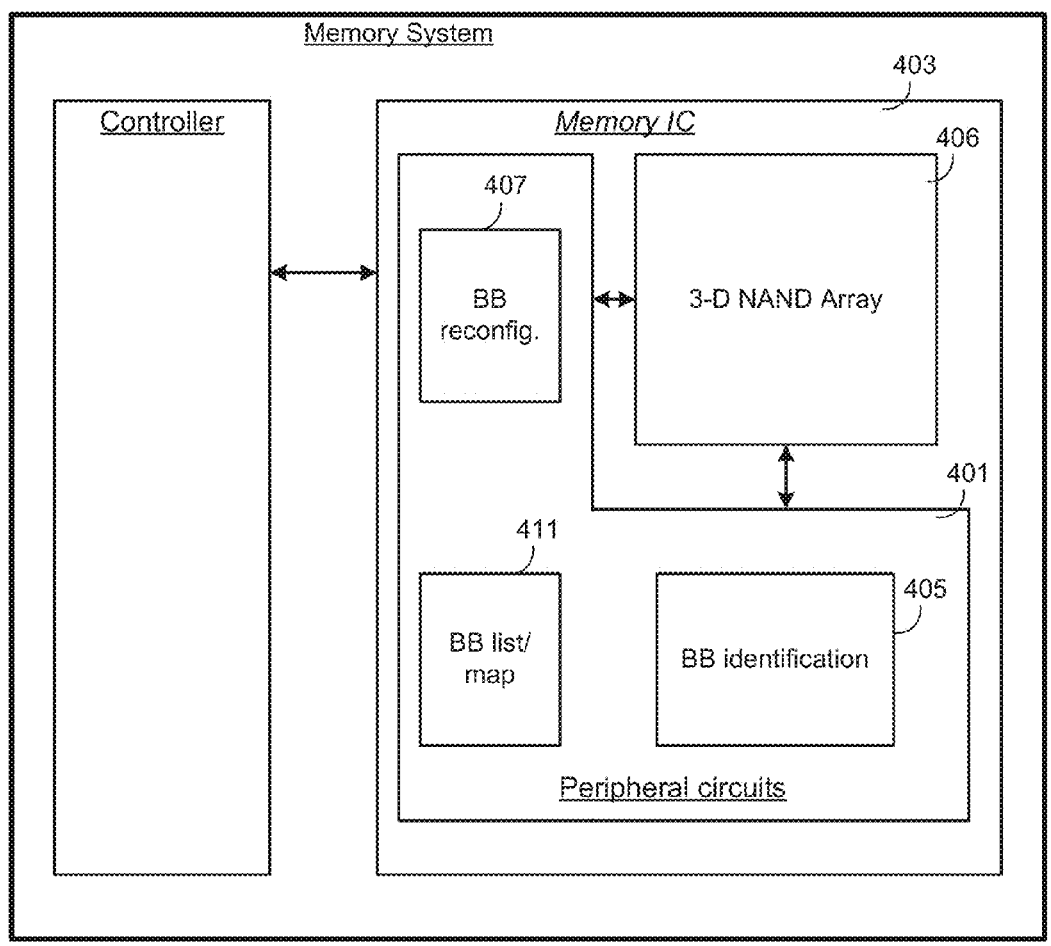
FIG. 15 shows an example of hardware for managing back gate transistors, select transistors, and dummy cells.

Various hardware arrangements may be used to carry out aspects of the present invention. FIG. 15 shows one example where peripheral circuits 401 on a memory chip 403 include bad block identification circuits 405 that identifies bad blocks, or bad portions of blocks, and bad block reconfiguring circuits 407. Bad block reconfiguring circuits 407 increase threshold voltages of back gate transistors and/or select transistors and/or host data memory cells, and/or dummy memory cells in a 3-D NAND array 406 (different embodiments may have one or more). Bad block reconfiguration circuit 407 may be similar in configuration to programming circuits used to program memory cells and the circuits may be combined in some cases. Reconfiguration circuits may be charge-increasing circuits that add charge to charge storage elements in order to increase threshold voltage. However, charge-increasing circuits generally add charge uniformly to back gate transistors, select transistors, host data memory cells, and/or dummy cells to bring them to a uniform specified level, whereas programming circuits program memory cells to various levels that reflect data to be stored. A bad block list/map 411 maintains information regarding location of bad blocks, and/or bad portions of blocks, so that further access is prohibited once a block, or portion, is identified as bad and is reconfigured.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a plurality of blocks of a block-erasable nonvolatile memory array comprising:
    identifying a block of the plurality of blocks as a bad block;
    in response to identifying the block as a bad block, recording location information for the bad block to thereby prevent any subsequent storage of host data in the bad block; and
    in response to identifying the block as a bad block, performing a reconfiguration of the block as a bad block by increasing threshold voltage of at least one transistor of the block.

2. The method of claim 1 wherein the at least one transistor is a select transistor.

3. The method of claim 1 wherein the at least one transistor is a memory cell transistor.

4. The method of claim 1 wherein the at least one transistor is a dummy memory cell transistor.

5. The method of claim 1 wherein the at least one transistor is a back gate transistor.

6. The method of claim 1 wherein the reconfiguration of the block as a bad block includes increasing threshold voltages of multiple select transistors and multiple memory cell transistors of the block.

7. The method of claim 6 wherein the reconfiguration of the block as a bad block includes increasing threshold voltages of all select transistors and all memory cell transistors of the block.

8. The method of claim 1 wherein the reconfiguration of the block as a bad block includes applying voltage pulses to memory cells of the block and verifying increased threshold voltages resulting from the voltage pulses.

9. The method of claim 1 further comprising, subsequent to identifying the block as a bad block, and prior to performing the reconfiguration of the block as a bad block, copying host data from the bad block to a location in the memory array that is outside the bad block.

10. The method of claim 1 wherein the nonvolatile memory array is a three-dimensional nonvolatile memory array that includes a plurality of horizontal bit lines that connect blocks of a plane including the block identified as a bad block.

11. The method of claim 10 wherein the plurality of horizontal bit lines connect vertical NAND strings of the plane, each vertical NAND string comprising a plurality of memory cells and a select transistor connected in series, and wherein the reconfiguration increases threshold voltages of the memory cells and the select transistors of the block thereby increasing resistance of the vertical NAND strings of the block, while leaving vertical NAND strings of other blocks in the plane unchanged.

12. The method of claim 1 wherein the identifying a block as a bad block occurs after a period of use of the nonvolatile memory array, including use of the block to successfully store host data.

13. The method of claim 1 wherein the identifying a block as a bad block occurs during initial test of the nonvolatile memory array, prior to any use of the block to store host data.

14. A block-erasable nonvolatile memory array comprising:
    a plurality of blocks of memory cells, each block having a plurality of NAND strings of memory cells with select transistors at each end of an individual NAND string;
    a bad block identification circuit that identifies a block as a bad block;

a bad block reconfiguration circuit that reconfigures a block as a bad block by increasing threshold voltages of transistors of the block; and a bad block mapping circuit that records a location of a bad block so that the bad block is not used for any storage of data subsequent to being identified as a bad block.

15. The nonvolatile memory array of claim 14 wherein the plurality of NAND strings are vertical NAND strings and wherein each memory cell contains a charge trapping layer and each select transistor contains a charge trapping layer.

16. A method of operating a plurality of blocks of a three dimensional nonvolatile NAND memory array comprising:

identifying a block of the plurality of blocks as a bad block;

in response to identifying the block as a bad block, recording location information for the bad block to prevent subsequent storage of host data in the bad block; and in response to identifying the block as a bad block, performing a reconfiguration of the block as a bad block by increasing threshold voltages of memory cells and increasing threshold voltages of select transistors of the block.

17. The method of claim 16 wherein increasing threshold voltages of memory cells includes programming all memory cells to a predetermined threshold voltage and verifying that substantially all memory cells reach the predetermined threshold voltage.

18. The method of claim 16 wherein increasing threshold voltages of memory cells includes programming all memory cells with a predetermined series of voltage pulses without verification.

19. The method of claim 18 wherein threshold voltages of select transistors are maintained in a first range in blocks that are not bad blocks, and wherein the reconfiguration increases threshold voltages of select transistors to a second range that is higher than the first range.

20. The method of claim 16 wherein the block is identified as a bad block because of a programming failure, further comprising copying data in the block to another block prior to performing the reconfiguration.

21. The method of claim 16 wherein the block is identified as a bad block because of failure to erase obsolete data from the block, wherein the reconfiguration of the block is performed without copying the obsolete data from the block.

22. A method of operating a block of a block-erasable nonvolatile memory array comprising:

identifying a portion of the block as a bad portion, wherein the bad portion consists of at least one set of strings in the block that is identified as a bad set of strings, with other sets of strings in the block left unreconfigured and subsequently used for storage of host data;

in response to identifying the portion as a bad portion, recording location information for the bad portion to prevent subsequent storage of host data in the bad portion; and in response to identifying the portion as a bad portion, performing a reconfiguration of the portion as a bad portion by increasing threshold voltage of at least one transistor of the bad portion, while leaving other portions of the block unreconfigured.

23. The method of claim 22 further comprising: subsequent to performing the reconfiguration of the portion as a bad portion storing host data in the other portions of the block, subsequently erasing the block, and subsequently repeating reconfiguration of the portion as a bad portion by increasing threshold voltage of at least one transistor of the bad portion, while leaving the other portions of the block unreconfigured.

* * * * *